United States Patent
Yang et al.

(10) Patent No.: US 12,451,345 B2
(45) Date of Patent: Oct. 21, 2025

(54) PECVD OF SiBN THIN FILMS WITH LOW LEAKAGE CURRENT

(71) Applicant: Applied Materials, Inc., Santa Clara, CA (US)

(72) Inventors: Chuanxi Yang, Los Altos, CA (US); Hang Yu, Woodland, CA (US); Sanjay Kamath, Fremont, CA (US); Deenesh Padhi, Sunnyvale, CA (US); Honggun Kim, San Jose, CA (US); Euhngi Lee, Santa Clara, CA (US); Zubin Huang, Santa Clara, CA (US); Diwakar N. Kedlaya, San Jose, CA (US); Rui Cheng, Santa Clara, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/650,014

(22) Filed: Apr. 29, 2024

(65) Prior Publication Data
US 2024/0304437 A1 Sep. 12, 2024

Related U.S. Application Data

(63) Continuation of application No. 16/725,226, filed on Dec. 23, 2019, now abandoned.
(Continued)

(51) Int. Cl.
*H01L 21/02* (2006.01)
*C23C 16/02* (2006.01)
(Continued)

(52) U.S. Cl.
CPC ...... *H01L 21/0217* (2013.01); *C23C 16/0209* (2013.01); *C23C 16/345* (2013.01); *C23C 16/513* (2013.01); *H01L 21/02274* (2013.01)

(58) Field of Classification Search
CPC ........... H01L 21/0217; H01L 21/02274; C23C 16/345; C23C 16/513; C23C 16/0209
See application file for complete search history.

(56) References Cited

U.S. PATENT DOCUMENTS

| 6,066,555 A | 5/2000 | Nulty et al. |
| 6,153,541 A | 11/2000 | Yao et al. |

(Continued)

FOREIGN PATENT DOCUMENTS

| CN | 104220637 A | 12/2014 |
| JP | 2010251654 A | 11/2010 |

(Continued)

OTHER PUBLICATIONS

Journal of Applied Physics 58, 484 (1985); Hydrogen bonding configurations in silicon nitride films prepared by plasma-enhanced deposition.
(Continued)

*Primary Examiner* — Michael G Miller
(74) *Attorney, Agent, or Firm* — Patterson + Sheridan, LLP

(57) ABSTRACT

Capacitor devices containing silicon boron nitride with high boron concentration are provided. In one or more examples, a capacitor device is provided and contains a stopper layer containing silicon boron nitride and disposed on a substrate, a dielectric layer disposed on the stopper layer, vias formed within the dielectric layer and the stopper layer, metal contacts disposed on bottoms of the vias, a nitride barrier layer containing a metal nitride material and disposed on walls of the vias and disposed on the metal contacts, and an oxide layer disposed within the vias on the nitride barrier layer, wherein the oxide layer contains one or more holes or voids formed therein. The silicon boron nitride contains about 18 atomic percent (at %) to about 50 at % of boron.

20 Claims, 4 Drawing Sheets

Related U.S. Application Data

(60) Provisional application No. 62/787,666, filed on Jan. 2, 2019.

(51) Int. Cl.
 *C23C 16/34* (2006.01)
 *C23C 16/513* (2006.01)

(56) References Cited

U.S. PATENT DOCUMENTS

| | | |
|---|---|---|
| 6,284,583 B1 | 9/2001 | Saida et al. |
| 6,326,064 B1 | 12/2001 | Denison et al. |
| 6,348,407 B1 | 2/2002 | Gupta et al. |
| 6,383,868 B1 | 5/2002 | Parekh et al. |
| 6,455,445 B2 | 9/2002 | Matsuki et al. |
| 6,514,880 B2 | 2/2003 | Matsuki et al. |
| 6,630,413 B2 | 10/2003 | Todd |
| 6,670,237 B1 | 12/2003 | Loh et al. |
| 6,730,573 B1 | 5/2004 | Ng et al. |
| 6,924,241 B2 | 8/2005 | Lee |
| 7,144,620 B2 | 12/2006 | Todd |
| 7,633,125 B2 | 12/2009 | Lu et al. |
| 7,879,681 B2 | 2/2011 | Kim et al. |
| 8,709,551 B2 | 4/2014 | Fox et al. |
| 8,741,394 B2 | 6/2014 | Haverkamp et al. |
| 8,847,355 B2 | 9/2014 | Chung |
| 8,883,269 B2 | 11/2014 | Won et al. |
| 8,999,453 B2 | 4/2015 | Shah et al. |
| 9,028,924 B2 | 5/2015 | Haverkamp et al. |
| 9,111,658 B2 | 8/2015 | Shah et al. |
| 9,142,610 B2 | 9/2015 | Kim et al. |
| 9,484,219 B2 | 11/2016 | Park et al. |
| 9,911,851 B2 | 3/2018 | Seo et al. |
| 10,214,816 B2 | 2/2019 | Haverkamp et al. |
| 2004/0087098 A1* | 5/2004 | Ng .................. H01L 23/5223 257/E21.582 |
| 2005/0118837 A1 | 6/2005 | Todd et al. |
| 2006/0160352 A1 | 7/2006 | Matsushita et al. |
| 2008/0081406 A1 | 4/2008 | Choo et al. |
| 2008/0293207 A1 | 11/2008 | Koutny, Jr. et al. |
| 2009/0057766 A1 | 3/2009 | Lu et al. |
| 2009/0098741 A1* | 4/2009 | Tanaka .............. H01L 21/02123 257/E21.24 |
| 2010/0087042 A1* | 4/2010 | Kim .................. H01L 23/5223 438/396 |
| 2011/0236594 A1 | 9/2011 | Haverkamp et al. |
| 2011/0236600 A1 | 9/2011 | Fox et al. |
| 2012/0142172 A1 | 6/2012 | Fox et al. |
| 2012/0171391 A1 | 7/2012 | Won et al. |
| 2012/0258261 A1 | 10/2012 | Reddy et al. |
| 2013/0157466 A1 | 6/2013 | Fox et al. |
| 2013/0171834 A1 | 7/2013 | Haverkamp et al. |
| 2014/0023784 A1 | 1/2014 | Fox |
| 2015/0013607 A1 | 1/2015 | Haverkamp et al. |
| 2016/0013049 A1 | 1/2016 | Ye et al. |
| 2016/0064386 A1* | 3/2016 | Park .................. H10B 12/033 438/381 |
| 2020/0211834 A1 | 7/2020 | Yang et al. |

FOREIGN PATENT DOCUMENTS

| | | |
|---|---|---|
| JP | 2010254654 A | 11/2010 |
| JP | 2013041879 A | 2/2013 |
| JP | 2016503578 A | 2/2016 |
| JP | 2016203578 A | 12/2016 |
| JP | 2019527933 A | 10/2019 |
| JP | 2020010031 A | 1/2020 |
| KR | 20120115962 A | 10/2012 |
| KR | 20140018861 A | 2/2014 |
| TW | 201341569 A | 10/2013 |
| TW | 201520358 A | 6/2015 |
| TW | 201710538 A | 3/2017 |
| WO | WO-2013123143 A1 * | 8/2013 .......... C23C 16/345 |
| WO | 2018118288 A1 | 6/2018 |

OTHER PUBLICATIONS 6.20PECVD.
Bonding structure and hydrogen content in silicon nitride thin films deposited by the electron cyclotron resonance plasma method.
34. Stress Control of Si-based PECVD Dielectrics.
Tapan K. Gupta, Copper Interconnect Technology, Dielectric Materials.
A. Dogan, Aug. 2005, The Reliability of the Silicon Nitride Dielectric in Capacitive Mems Switches.
C4Silicon-nitride films.
Hirao_1988_Jpn._J._Appl._Phys._27_30, Hydrogen Concentration and Bond Configurations in Silicon Nitride Films Prepared by ECR Plasma CVD Method.
Iedm09-Final, New insight on the charge trapping mechanisms of SiN-based memory by atomistic simulations and electrical modeling.
L_Sullivan_1974_J._Phys._ D%3A_Appl._Phys._7_314, Conduction in amorphous thin films of silicon nitride under non uniform electric fields.
Maeda_1987_Jpn._J._Appl._Phys._26_660, Low Dielectric Constant Amorphous SiBN Ternary Films Prepared by Plasma Enhanced Deposition.
Norwegian University of Science and Technology, Electrical Caracterization of Amorphous Silicon Nitride Passivation Layers for Crystalline Silicon Solar Cells.
Journal of Applied Physics 86, 1843 (1999); MotaF_1999_Hydrogen Role on the Properties of amorphous silicon nitride.
PacchioniG_1999_Electronic structure and spectral properties of paramagnetic point defects in Si3N4.
Resume_Xizhu Zhao_IE_latest.
RobertsonJ_1983_Defect and Impurity States in Silicon Nitride.
RobertsonJ_1984_Gap States in Silicon Nitride.
WarrenW_1991_Energy Level of the Nitrogen Dangling bond in amorphous silicon nitride.
WarrenW_1993_Si and N Dangling Bond Creation in silicon nitride thin films.
S.J. Park, Stability of a Si—H TFT After High Temperature Annealing.
International Search Report and Written Opinion dated Apr. 29, 2020 for Application No. PCT/US2019/068270.
Taiwanese Office Action dated Aug. 16, 2023 for Application No. 109100033.
Japanese Office Action dated Jan. 16, 2024 for Application No. 2021-538968.
Korean Office Action dated Mar. 20, 2024 for Application No. 10-2021-7024206.
Chinese Office Action dated Sep. 12, 2024 for Application No. 201980089580.7.
Chinese Office Action dated Apr. 25, 2025 for Application No. 201980089580.7.
Taiwan Office Action dated May 2, 2025 for Application No. 113127292.
Japanese Office Action dated Jun. 24, 2025 for Application No. 2024-066173.

\* cited by examiner

PECVD OF SiBN THIN FILMS WITH LOW LEAKAGE CURRENT

CROSS-REFERENCE TO RELATED APPLICATIONS

This application is a continuation of U.S. patent application Ser. No. 16/725,226, filed Dec. 23, 2019, which claims priority to U.S. Pat. Appl. No. 62/787,666, filed on Jan. 2, 2019, which herein is incorporated by reference.

BACKGROUND

Field

Embodiments of the present disclosure generally relate to deposition processes, and more specifically relate to methods for forming films containing silicon boron nitride (SiBN).

Description of the Related Art

In semiconductor manufacturing, various devices may be formed. Such devices include dynamic random-access memory (DRAM) devices having silicon and nitrogen containing stopper and supporter layers. For many DRAM devices, there is a need to fill the silicon and nitrogen containing layer to also contain boron. However, silicon boron nitride containing layers generally have unfavorable thermal budgets and high leakage current values. The high thermal budget increases boron diffusion during additional DRAM device forming processes, such as wet etching, causing deformation and the high leakage current results in results in electrical short circuiting between the capacitors of DRAM devices.

Therefore, there is a need for improved silicon boron nitride layers and methods for forming silicon boron nitride layers having a relatively high boron concentration and a relatively low leakage current.

SUMMARY

Embodiments of the present disclosure generally relate to improved silicon boron nitride layers and methods for forming silicon boron nitride layers having a relatively high boron concentration and a relatively low leakage current. In some examples, the silicon boron nitride layer is a supporter layer and/or a stopper layer within a capacitor or other electronic device.

In one or more embodiments, a method for forming a silicon boron nitride layer is provided and includes positioning a substrate on a pedestal in a process region within a process chamber, heating a pedestal retaining the substrate to a deposition temperature of about 225° C. to about 575° C., and introducing a first flow of a first process gas and a second flow of a second process gas to the process region. The first flow of the first process gas contains silane having a flow rate of about 1 sccm to about 500 sccm, ammonia having a flow rate of about 10 sccm to about 5,000 sccm, helium having a flow rate of about 500 sccm to about 20,000 sccm, nitrogen ($N_2$) having a flow rate of about 5,000 sccm to about 25,000 sccm, argon having a flow rate of about 50 sccm to about 10,000 sccm, and hydrogen ($H_2$) having a flow rate of about 50 sccm to about 20,000 sccm. The second flow of the second process gas contains about 2 molar percent (mol %) to about 15 mol % of diborane, about 85 mol % to about 98 mol % of hydrogen, and a flow rate of about 1 sccm to about 5,000 sccm. The method also includes forming a plasma concurrently with the first flow of the first process gas and the second flow of the second process gas to the process region and exposing the substrate to the first process gas, the second process gas, and the plasma to deposit the silicon boron nitride layer on the substrate.

In other embodiments, a method for forming a silicon boron nitride layer is provided and includes positioning a substrate on a pedestal in a process region within a process chamber and introducing a first flow of a first process gas and a second flow of a second process gas to the process region. The first flow of the first process gas contains a silicon-containing precursor, a nitrogen-containing precursor, hydrogen, and at least two gases selected from the group consisting of argon, helium, nitrogen, and any combination thereof. The second flow of the second process gas contains about 2 mol % to about 15 mol % of diborane, about 85 mol % to about 98 mol % of hydrogen, and a flow rate of about 1 sccm to about 5,000 sccm. The method also includes forming a plasma concurrently with the first flow of the first process gas and the second flow of the second process gas to the process region and exposing the substrate to the first process gas, the second process gas, and the plasma to deposit the silicon boron nitride layer on the substrate. The silicon boron nitride layer contains about 10 atomic percent (at %) to about 50 at % of boron, has a nitrogen to silicon atomic ratio of about 1.05 to about 1.5, and has a leakage current of less than $1 \times 10^{-9}$ $A/cm^2$ at 1.5 MV/cm.

In some embodiments, a method for forming a silicon boron nitride layer is provided and includes positioning a substrate on a pedestal in a process region within a process chamber, heating a pedestal retaining the substrate to a deposition temperature of about 225° C. to about 575° C., maintaining the process region at a pressure of about 2 Torr to about 8 Torr, and introducing a first flow of a first process gas to the process region. The first flow of the first process gas contains silane having a flow rate of about 1 sccm to about 500 sccm, ammonia having a flow rate of about 10 sccm to about 5,000 sccm, helium having a flow rate of about 500 sccm to about 20,000 sccm, nitrogen having a flow rate of about 5,000 sccm to about 25,000 sccm, argon having a flow rate of about 50 sccm to about 10,000 sccm, and hydrogen having a flow rate of about 50 sccm to about 20,000 sccm. The method further includes discontinuing the first flow of the first process gases, forming a plasma concurrently with a second flow of a second process gas to the process region, and forming the silicon boron nitride layer on the substrate. The second flow of the second process gas has a flow rate of about 1 sccm to about 5,000 sccm and contains about 2 mol % to about 15 mol % of diborane and about 85 mol % to about 98 mol % of hydrogen.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
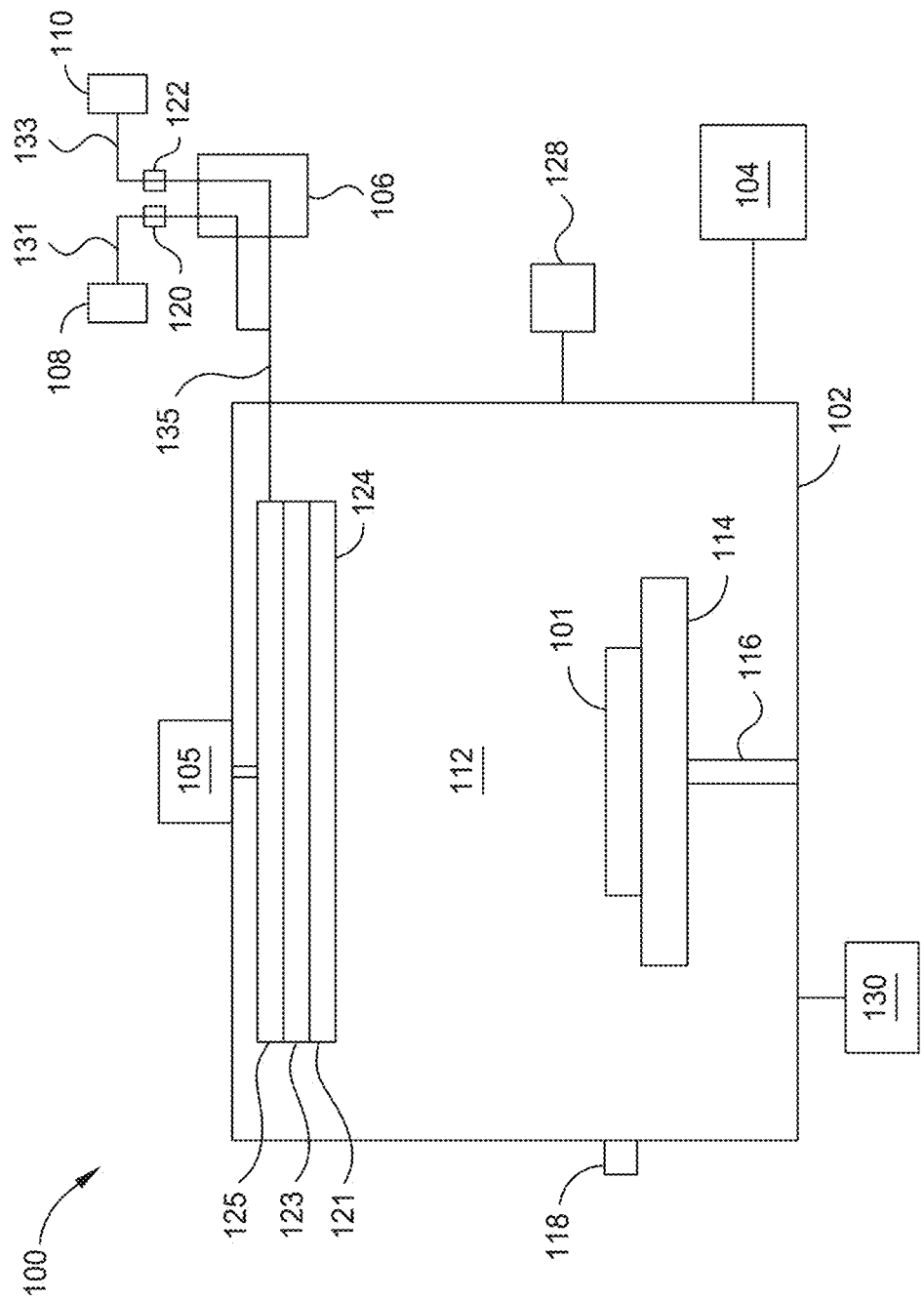
FIG. 1 depicts a schematic cross-sectional view of a process chamber, according to one or more embodiments described and discussed herein.

Embodiments of the present disclosure generally relate to improved silicon boron nitride layers and methods for forming silicon boron nitride layers. These silicon boron nitride materials and layers have relatively high boron concentrations and low leakage currents, as well as other properties which are applicable for use in electronic devices, such as capacitors. For example, the silicon boron nitride layers described and discussed here can be used as supporter layers and/or stopper layers within a capacitor or other electronic device. The silicon boron nitride layer can have a boron concentration of about 10 atomic percent (at %) to about 50 at %, such as about 20 at % to about 40 at % and a leakage current of less than $1\times10^{-9}$ A/cm$^2$ at 1.5 MV/cm.

In one or more embodiments, methods for forming the silicon boron nitride layer includes positioning the substrate on a pedestal in a process region within a process chamber, heating a pedestal retaining the substrate to a deposition temperature, and introducing a first flow of a first process gas and a second flow of a second process gas to the process region. In some embodiments, a plasma is concurrently ignited or otherwise formed with the first flow of the first process gas and the second flow of the second process gas to the process region. The plasma can be generated remotely of the process chamber or in-situ the process chamber. The substrate is exposed to the first process gas, the second process gas, and the plasma to deposit the silicon boron nitride layer on the substrate during a plasma enhanced chemical vapor deposition (PE-CVD) process.

The pedestal retaining the substrate disposed thereon is heated to a deposition temperature of about 225° C., about 250° C., about 300° C., about 350° C., about 400° C., or about 450° C. to about 475° C., about 500° C., about 525° C., about 550° C., about 560° C., about 570° C., about 575° C., about 580° C., or about 600° C. during the PE-CVD process. For example, the substrate is heated to a deposition temperature of about 225° C. to about 600° C., about 225° C. to about 575° C., about 225° C. to about 560° C., about 225° C. to about 550° C., about 225° C. to about 500° C., about 225° C. to about 450° C., about 225° C. to about 400° C., about 225° C. to about 350° C., about 225° C. to about 300° C., about 350° C. to about 600° C., about 350° C. to about 575° C., about 350° C. to about 560° C., about 350° C. to about 550° C., about 350° C. to about 500° C., about 350° C. to about 450° C., about 350° C. to about 400° C., about 350° C. to about 375° C., about 450° C. to about 600° C., about 450° C. to about 575° C., about 450° C. to about 560° C., about 450° C. to about 550° C., about 450° C. to about 500° C., or about 450° C. to about 475° C.

The process region is maintained at a pressure of less than 100 Torr, less than 50 Torr, less than 20 Torr, or less than 10 Torr during the PE-CVD process. The process region is maintained at a pressure of about 0.5 Torr, about 1 Torr, about 2 Torr, about 3 Torr, or about 4 Torr to about 5 Torr, about 6 Torr, about 7 Torr, about 8 Torr, or about 9 Torr. For example, the process region is maintained at a pressure of about 0.5 Torr to less than 10 Torr, about 2 Torr to less than 10 Torr, about 2 Torr to about 8 Torr, about 2 Torr to about 6 Torr, about 2 Torr to about 5 Torr, about 2 Torr to about 4 Torr, about 3 Torr to less than 10 Torr, about 3 Torr to about 8 Torr, about 3 Torr to about 6 Torr, about 3 Torr to about 5 Torr, about 3 Torr to about 4 Torr, about 4 Torr to less than 10 Torr, about 4 Torr to about 8 Torr, about 4 Torr to about 6 Torr, or about 4 Torr to about 5 Torr.

The pedestal is positioned at a process distance which is the distance between the pedestal and the showerhead within the process chamber during the PE-CVD process. The process distance is about 100 mil (about 2.5 millimeter (mm)), about 200 mil (about 5 mm), about 300 mil (about 7.5 mm), or about 400 mil (about 10 mm) to about 500 mil (about 12.5 mm), about 600 mil (about 15 mm), about 800 mil (about 20 mm), about 1,000 mil (about 25.4 mm), about 2,000 mil (about 50.8 mm), or about 5,000 mil (about 127 mm). For example, the process distance is about 100 mil to about 5,000 mil, about 100 mil to about 2,000 mil, about 100 mil to about 1,000 mil, about 100 mil to about 800 mil, about 100 mil to about 600 mil, about 100 mil to about 500 mil, about 100 mil to about 400 mil, about 100 mil to about 300 mil, about 300 mil to about 2,000 mil, about 300 mil to about 1,000 mil, about 300 mil to about 800 mil, about 300 mil to about 600 mil, about 300 mil to about 500 mil, or about 300 mil to about 400 mil.

The first flow of the first process gas contains one or more silicon-containing precursors, one or more nitrogen-containing precursors, hydrogen ($H_2$), and at least two process or carrier gases, selected from argon, helium, nitrogen ($N_2$), or any combination thereof. Exemplary silicon-containing precursors can be or include silane, disilane, trisilane, tetrasilane, or any combination thereof. Exemplary nitrogen-containing precursors can be or include ammonia, hydrazine, one or more alkylamines (e.g., dimethylamine), or any combination thereof. In one or more examples, the first process gas contains silane, ammonia, hydrogen ($H_2$), argon, helium, and nitrogen ($N_2$).

The first flow of the first process gas contains a silicon-containing precursor (e.g., silane) having a flow rate of about 1 sccm, about 5 sccm, about 10 sccm, about 20 sccm, about 30 sccm, or about 50 sccm to about 80 sccm, about 100 sccm, about 150 sccm, about 200 sccm, about 250 sccm, about 300 sccm, about 400 sccm, about 500 sccm, about 800 sccm, about 1,000 sccm, about 1,500 sccm, or about 2,000 sccm. For example, the first flow of the first process gas contains a silicon-containing precursor (e.g., silane) having a flow rate of about 1 sccm to about 2,000 sccm, about 1 sccm to about 1,000 sccm, about 1 sccm to about 500 sccm, about 1 sccm to about 250 sccm, about 1 sccm to about 100 sccm, about 1 sccm to about 50 sccm, about 10 sccm to about 2,000 sccm, about 10 sccm to about 1,000 sccm, about 10 sccm to about 500 sccm, about 10 sccm to about 250 sccm, about 10 sccm to about 100 sccm, about 10 sccm to about 50 sccm, about 20 sccm to about 2,000 sccm, about 20 sccm to about 1,000 sccm, about 20 sccm to about 500 sccm, about 20 sccm to about 250 sccm, about 20 sccm to about 100 sccm, or about 20 sccm to about 50 sccm.

The first flow of the first process gas contains a nitrogen-containing precursor (e.g., ammonia) having a flow rate of about 1 sccm, about 10 sccm, about 50 sccm, about 80 sccm, about 100 sccm, about 150 sccm, about 200 sccm, about 250 sccm, about 300 sccm, about 500 sccm, or about 800 sccm to about 1,000 sccm, about 1,500 sccm, about 2,000 sccm, about 2,500 sccm, about 3,000 sccm, about 4,000 sccm, about 5,000 sccm, about 7,000 sccm, about 8,500 sccm, or about 10,000 sccm. For example, the first flow of the first process gas contains a nitrogen-containing precursor (e.g., ammonia) having a flow rate of about 1 sccm to about 10,000 sccm, about 10 sccm to about 10,000 sccm, about 10 sccm to about 5,000 sccm, about 10 sccm to about 4,000 sccm, about 10 sccm to about 3,000 sccm, about 10 sccm to about 2,000 sccm, about 10 sccm to about 1,500 sccm, about 10 sccm to about 1,000 sccm, about 10 sccm to about 800 sccm, about 10 sccm to about 500 sccm, about 10 sccm to about 300 sccm, about 50 sccm to about 10,000 sccm, about 50 sccm to about 5,000 sccm, about 50 sccm to about 4,000 sccm, about 50 sccm to about 3,000 sccm, about 50 sccm to about 2,000 sccm, about 50 sccm to about 1,500 sccm, about 50 sccm to about 1,000 sccm, about 50 sccm to about 800 sccm, about 50 sccm to about 500 sccm, about 50 sccm to about 300 sccm, about 100 sccm to about 10,000 sccm, about 100 sccm to about 5,000 sccm, about 100 sccm to about 4,000 sccm, about 100 sccm to about 3,000 sccm, about 100 sccm to about 2,000 sccm, about 100 sccm to about 1,500 sccm, about 100 sccm to about 1,000 sccm, about 100 sccm to about 800 sccm, about 100 sccm to about 500 sccm, or about 100 sccm to about 300 sccm.

The first flow of the first process gas contains helium having a flow rate of about 100 sccm, about 500 sccm, about 750 sccm, or about 1,000 sccm to about 1,500 sccm, about 2,000 sccm, about 5,000 sccm, about 8,000 sccm, about 10,000 sccm, about 15,000 sccm, about 20,000 sccm, about 30,000 sccm, about 40,000 sccm, or about 50,000 sccm. For example, the first flow of the first process gas contains helium having a flow rate of about 100 sccm to about 50,000 sccm, about 500 sccm to about 50,000 sccm, about 500 sccm to about 40,000 sccm, about 500 sccm to about 20,000 sccm, about 500 sccm to about 15,000 sccm, about 500 sccm to about 12,000 sccm, about 500 sccm to about 10,000 sccm, about 500 sccm to about 8,000 sccm, about 500 sccm to about 5,000 sccm, about 500 sccm to about 1,000 sccm, about 750 sccm to about 50,000 sccm, about 750 sccm to about 40,000 sccm, about 750 sccm to about 20,000 sccm, about 750 sccm to about 15,000 sccm, about 750 sccm to about 12,000 sccm, about 750 sccm to about 10,000 sccm, about 750 sccm to about 8,000 sccm, about 750 sccm to about 5,000 sccm, about 750 sccm to about 1,000 sccm, about 1,000 sccm to about 50,000 sccm, about 1,000 sccm to about 40,000 sccm, about 1,000 sccm to about 20,000 sccm, about 1,000 sccm to about 15,000 sccm, about 1,000 sccm to about 12,000 sccm, about 1,000 sccm to about 10,000 sccm, about 1,000 sccm to about 8,000 sccm, about 1,000 sccm to about 5,000 sccm, about 1,000 sccm to about 3,000 sccm, about 5,000 sccm to about 50,000 sccm, about 5,000 sccm to about 40,000 sccm, about 5,000 sccm to about 30,000 sccm, about 5,000 sccm to about 22,000 sccm, about 5,000 sccm to about 20,000 sccm, about 5,000 sccm to about 18,000 sccm, about 5,000 sccm to about 15,000 sccm, about 5,000 sccm to about 12,000 sccm, about 5,000 sccm to about 10,000 sccm, or about 5,000 sccm to about 8,000 sccm.

The first flow of the first process gas contains nitrogen (N$_2$) having a flow rate of about 100 sccm, about 500 sccm, about 1,000 sccm, about 1,500 sccm, about 2,000 sccm, about 3,500 sccm, about 5,000 sccm, about 8,000 sccm, about 10,000 sccm, about 12,000 sccm, or about 15,000 sccm to about 18,000 sccm, about 20,000 sccm, about 22,000 sccm, about 25,000 sccm, about 30,000 sccm, about 35,000 sccm, about 40,000 sccm, or about 50,000 sccm. For example, the first flow of the first process gas contains nitrogen having a flow rate of about 100 sccm to about 50,000 sccm, about 500 sccm to about 50,000 sccm, about 500 sccm to about 40,000 sccm, about 500 sccm to about 20,000 sccm, about 500 sccm to about 15,000 sccm, about 500 sccm to about 12,000 sccm, about 500 sccm to about 10,000 sccm, about 500 sccm to about 8,000 sccm, about 500 sccm to about 5,000 sccm, about 500 sccm to about 1,000 sccm, about 1,000 sccm to about 50,000 sccm, about 1,000 sccm to about 40,000 sccm, about 1,000 sccm to about 30,000 sccm, about 1,000 sccm to about 25,000 sccm, about 1,000 sccm to about 22,000 sccm, about 1,000 sccm to about 20,000 sccm, about 1,000 sccm to about 15,000 sccm, about 1,000 sccm to about 12,000 sccm, about 1,000 sccm to about 10,000 sccm, about 1,000 sccm to about 8,000 sccm, about 1,000 sccm to about 5,000 sccm, about 1,000 sccm to about 3,000 sccm, about 5,000 sccm to about 50,000 sccm, about 5,000 sccm to about 40,000 sccm, about 5,000 sccm to about 30,000 sccm, about 5,000 sccm to about 25,000 sccm, about 5,000 sccm to about 22,000 sccm, about 5,000 sccm to about 20,000 sccm, about 5,000 sccm to about 18,000 sccm, about 5,000 sccm to about 15,000 sccm, about 5,000 sccm to about 12,000 sccm, about 5,000 sccm to about 10,000 sccm, about 5,000 sccm to about 8,000 sccm, about 10,000 sccm to about 50,000 sccm, about 10,000 sccm to about 40,000 sccm, about 10,000 sccm to about 30,000 sccm, about 10,000 sccm to about 25,000 sccm, about 10,000 sccm to about 22,000 sccm, about 10,000 sccm to about 20,000 sccm, about 10,000 sccm to about 18,000 sccm, about 10,000 sccm to about 15,000 sccm, about 10,000 sccm to about 12,000 sccm, about 12,000 sccm to about 50,000 sccm, about 12,000 sccm to about 40,000 sccm, about 12,000 sccm to about 30,000 sccm, about 12,000 sccm to about 25,000 sccm, about 12,000 sccm to about 22,000 sccm, about 12,000 sccm to about 20,000 sccm, about 12,000 sccm to about 18,000 sccm, or about 12,000 sccm to about 15,000 sccm.

The first flow of the first process gas contains argon having a flow rate of about 50 sccm, about 100 sccm, about 200 sccm, about 300 sccm, about 500 sccm, about 750 sccm, about 1,000 sccm, about 1,500 sccm, about 2,000 sccm, about 3,000 sccm, about 4,000 sccm, or about 5,000 sccm to about 6,000 sccm, about 7,500 sccm, about 8,000 sccm, about 10,000 sccm, about 12,000 sccm, about 15,000 sccm, about 20,000 sccm, about 30,000 sccm, about 40,000 sccm, or about 50,000 sccm. For example, the first flow of the first process gas contains argon having a flow rate of about 50 sccm to about 50,000 sccm, about 50 sccm to about 30,000 sccm, about 50 sccm to about 25,000 sccm, about 50 sccm to about 20,000 sccm, about 50 sccm to about 15,000 sccm, about 50 sccm to about 12,000 sccm, about 50 sccm to about 10,000 sccm, about 50 sccm to about 7,500 sccm, about 50 sccm to about 6,000 sccm, about 50 sccm to about 5,000 sccm, about 50 sccm to about 3,000 sccm, about 50 sccm to about 1,000 sccm, about 200 sccm to about 50,000 sccm, about 200 sccm to about 30,000 sccm, about 200 sccm to about 25,000 sccm, about 200 sccm to about 20,000 sccm, about 200 sccm to about 15,000 sccm, about 200 sccm to about 12,000 sccm, about 200 sccm to about 10,000 sccm, about 200 sccm to about 7,500 sccm, about 200 sccm to about 6,000 sccm, about 200 sccm to about 5,000 sccm, about 200 sccm to about 3,000 sccm, about 200 sccm to about 1,000 sccm, about 500 sccm to about 50,000 sccm, about 500 sccm to about 30,000 sccm, about 500 sccm to about 25,000 sccm, about 500 sccm to about 20,000 sccm, about 500 sccm to about 15,000 sccm, about 500 sccm to about 12,000 sccm, about 500 sccm to about 10,000 sccm, about 500 sccm to about 7,500 sccm, about 500 sccm to about 6,000 sccm, about 500 sccm to about 5,000 sccm, about 500 sccm to about 3,000 sccm, or about 500 sccm to about 1,000 sccm.

The first flow of the first process gas contains hydrogen ($H_2$) having a flow rate of about 50 sccm, about 100 sccm, about 200 sccm, about 300 sccm, about 500 sccm, about 750 sccm, about 1,000 sccm, about 1,500 sccm, about 2,000 sccm, about 3,000 sccm, about 4,000 sccm, or about 5,000 sccm to about 6,000 sccm, about 7,500 sccm, about 8,000 sccm, about 10,000 sccm, about 12,000 sccm, about 15,000 sccm, about 20,000 sccm, about 30,000 sccm, about 40,000 sccm, or about 50,000 sccm. For example, the first flow of the first process gas contains hydrogen having a flow rate of about 50 sccm to about 50,000 sccm, about 50 sccm to about 30,000 sccm, about 50 sccm to about 25,000 sccm, about 50 sccm to about 20,000 sccm, about 50 sccm to about 15,000 sccm, about 50 sccm to about 12,000 sccm, about 50 sccm to about 10,000 sccm, about 50 sccm to about 7,500 sccm, about 50 sccm to about 6,000 sccm, about 50 sccm to about 5,000 sccm, about 50 sccm to about 3,000 sccm, about 50 sccm to about 1,000 sccm, about 200 sccm to about 50,000 sccm, about 200 sccm to about 30,000 sccm, about 200 sccm to about 25,000 sccm, about 200 sccm to about 20,000 sccm, about 200 sccm to about 15,000 sccm, about 200 sccm to about 12,000 sccm, about 200 sccm to about 10,000 sccm, about 200 sccm to about 7,500 sccm, about 200 sccm to about 6,000 sccm, about 200 sccm to about 5,000 sccm, about 200 sccm to about 3,000 sccm, about 200 sccm to about 1,000 sccm, about 500 sccm to about 50,000 sccm, about 500 sccm to about 30,000 sccm, about 500 sccm to about 25,000 sccm, about 500 sccm to about 20,000 sccm, about 500 sccm to about 15,000 sccm, about 500 sccm to about 12,000 sccm, about 500 sccm to about 10,000 sccm, about 500 sccm to about 7,500 sccm, about 500 sccm to about 6,000 sccm, about 500 sccm to about 5,000 sccm, about 500 sccm to about 3,000 sccm, or about 500 sccm to about 1,000 sccm.

In one or more examples, the first flow of the first process gas contains silane having a flow rate of about 1 sccm to about 500 sccm, ammonia having a flow rate of about 10 sccm to about 5,000 sccm, helium having a flow rate of about 500 sccm to about 20,000 sccm, nitrogen ($N_2$) having a flow rate of about 5,000 sccm to about 25,000 sccm, argon having a flow rate of about 50 sccm to about 10,000 sccm, and hydrogen ($H_2$) having a flow rate of about 50 sccm to about 20,000 sccm. In other examples, the first flow of the first process gas contains the silane having a flow rate of about 10 sccm to about 250 sccm, the ammonia having a flow rate of about 50 sccm to about 2,000 sccm, the helium having a flow rate of about 750 sccm to about 15,000 sccm, the nitrogen having a flow rate of about 10,000 sccm to about 20,000 sccm, the argon having a flow rate of about 200 sccm to about 7,500 sccm, and the hydrogen having a flow rate of about 200 sccm to about 15,000 sccm. In some examples, the first flow of the first process gas contains the silane having a flow rate of about 20 sccm to about 100 sccm, the ammonia having a flow rate of about 100 sccm to about 1,000 sccm, the helium having a flow rate of about 1,000 sccm to about 10,000 sccm, the nitrogen having a flow rate of about 12,000 sccm to about 18,000 sccm, the argon having a flow rate of about 500 sccm to about 5,000 sccm, and the hydrogen having a flow rate of about 500 sccm to about 10,000 sccm.

In one or more embodiments, the second process gas contains one or more boron-containing precursors (e.g., diborane) and hydrogen ($H_2$). In some examples, the second process gas contains about 20 mol % or less of diborane and the remainder is hydrogen. The second process gas contains the boron-containing precursors (e.g., diborane) at a concentration of about 1 molar percent (mol %), about 2 mol %, about 3 mol %, about 4 mol %, or about 5 mol % to about 6 mol %, about 8 mol %, about 10 mol %, about 12 mol %, about 15 mol %, or about 20 mol %. For example, the second process gas contains the boron-containing precursors (e.g., diborane) at a concentration of about 2 mol % to about 20 mol %, about 2 mol % to about 15 mol %, about 2 mol % to about 12 mol %, about 2 mol % to about 10 mol %, about 2 mol % to about 8 mol %, about 2 mol % to about 5 mol %, about 2 mol % to about 3 mol %, about 3 mol % to about 20 mol %, about 3 mol % to about 15 mol %, about 3 mol % to about 12 mol %, about 3 mol % to about 10 mol %, about 3 mol % to about 8 mol %, about 3 mol % to about 5 mol %, about 5 mol % to about 20 mol %, about 5 mol % to about 15 mol %, about 5 mol % to about 12 mol %, about 5 mol % to about 10 mol %, or about 5 mol % to about 8 mol %.

The second process gas contains the hydrogen ($H_2$) at a concentration of about 80 mol %, about 85 mol %, about 88 mol %, about 90 mol %, about 92 mol %, about 94 mol %, or about 95 mol % to about 96 mol %, about 97 mol %, about 98 mol %, or about 99 mol %. For example, the second process gas contains hydrogen at a concentration of about 80 mol % to about 99 mol %, about 80 mol % to about 95 mol %, about 80 mol % to about 92 mol %, about 80 mol % to about 90 mol %, about 80 mol % to about 88 mol %, about 80 mol % to about 85 mol %, about 85 mol % to about 99 mol %, about 85 mol % to about 98 mol %, about 85 mol % to about 95 mol %, about 85 mol % to about 92 mol %, about 85 mol % to about 90 mol %, about 85 mol % to about 88 mol %, about 88 mol % to about 97 mol %, about 90 mol % to about 99 mol %, about 90 mol % to about 95 mol %, about 90 mol % to about 92 mol %, or about 95 mol % to about 99 mol %.

In one or more examples, the second flow of the second process gas has a flow rate of about 1 sccm, about 5 sccm, about 10 sccm, about 20 sccm, about 35 sccm, about 50 sccm, about 65 sccm, about 80 sccm, or about 100 sccm to about 150 sccm, about 200 sccm, about 300 sccm, about 500 sccm, about 800 sccm, about 1,000 sccm, about 1,500 sccm, about 2,000 sccm, about 3,000 sccm, about 4,000 sccm, or about 5,000 sccm. For example, the second flow of the second process gas has a flow rate of about 1 sccm to about 5,000 sccm, about 1 sccm to about 3,000 sccm, about 1 sccm to about 2,000 sccm, about 1 sccm to about 1,000 sccm, about 1 sccm to about 500 sccm, about 1 sccm to about 300 sccm, about 1 sccm to about 200 sccm, about 1 sccm to about 100 sccm, about 1 sccm to about 50 sccm, about 5 sccm to about 5,000 sccm, about 5 sccm to about 3,000 sccm, about 5 sccm to about 2,000 sccm, about 5 sccm to about 1,000 sccm, about 5 sccm to about 500 sccm, about 5 sccm to about 300 sccm, about 5 sccm to about 200 sccm, about 5 sccm to about 100 sccm, about 5 sccm to about 50 sccm, about 10 sccm to about 5,000 sccm, about 10 sccm to about 3,000 sccm, about 10 sccm to about 2,000 sccm, about 10 sccm to about 1,000 sccm, about 10 sccm to about 500 sccm, about 10 sccm to about 300 sccm, about 10 sccm to about 200 sccm, about 10 sccm to about 100 sccm, or about 10 sccm to about 50 sccm.

In one or more examples, the second process gas contains about 2 mol % to about 15 mol % of diborane and about 85 mol % to about 98 mol % of hydrogen, and has a flow rate of about 1 sccm to about 5,000 sccm. In other examples, the second process gas contains about 3 mol % to about 12 mol % of diborane and about 88 mol % to about 97 mol % of hydrogen, and has a flow rate of about 5 sccm to about 2,000 sccm. In some examples, the second process gas contains about 5 mol % to about 10 mol % of diborane and about 90 mol % to about 95 mol % of hydrogen, and has a flow rate of about 10 sccm to about 1,000 sccm.

Properties of the Silicon Nitride Layer or Material

The silicon boron nitride layer contains at least boron, silicon, nitrogen, and hydrogen. In some examples, the silicon boron nitride layer contains more nitrogen than silicon, more silicon than boron, and more boron than hydrogen. In one or more embodiments, the silicon boron nitride layer can have a boron concentration of about 10 atomic percent (at %), about 12 at %, about 15 at %, or about 18 at % to about 20 at %, about 22 at %, about 25 at %, about 28 at %, about 30 at %, about 35 at %, about 40 at %, about 45 at %, or about 50 at %. For example, the silicon boron nitride layer can have a boron concentration of about 10 at % to about 50 at %, about 10 at % to about 45 at %, about 10 at % to about 40 at %, about 10 at % to about 35 at %, about 10 at % to about 30 at %, about 10 at % to about 28 at %, about 10 at % to about 25 at %, about 10 at % to about 22 at %, about 10 at % to about 20 at %, about 10 at % to about 18 at %, about 12 at % to about 45 at %, about 12 at % to about 40 at %, about 12 at % to about 30 at %, about 15 at % to about 50 at %, about 15 at % to about 45 at %, about 15 at % to about 40 at %, about 15 at % to about 35 at %, about 15 at % to about 30 at %, about 15 at % to about 28 at %, about 15 at % to about 25 at %, about 15 at % to about 22 at %, about 15 at % to about 20 at %, about 15 at % to about 18 at %, about 20 at % to about 50 at %, about 20 at % to about 45 at %, about 20 at % to about 40 at %, about 20 at % to about 35 at %, about 20 at % to about 30 at %, about 20 at % to about 28 at %, about 20 at % to about 25 at %, or about 20 at % to about 22 at %.

The silicon boron nitride layer can have a hydrogen concentration of about 1 at %, about 2 at %, about 3 at %, about 4 at %, about 5 at %, or about 6 at % to about 7 at %, about 8 at %, about 10 at %, about 12 at %, about 15 at %, about 18 at %, or about 20 at %. For example, the silicon boron nitride layer can have a hydrogen concentration of about 1 at % to about 20 at %, about 1 at % to about 15 at %, about 2 at % to about 15 at %, about 3 at % to about 15 at %, about 5 at % to about 15 at %, about 6 at % to about 15 at %, about 8 at % to about 15 at %, about 10 at % to about 15 at %, about 12 at % to about 15 at %, about 1 at % to about 10 at %, about 2 at % to about 10 at %, about 3 at % to about 10 at %, about 5 at % to about 10 at %, about 6 at % to about 10 at %, or about 8 at % to about 10 at %.

The silicon boron nitride layer can have a nitrogen concentration of about 20 at %, about 22 at %, about 25 at %, about 28 at %, or about 30 at % to about 32 at %, about 35 at %, about 38 at %, about 40 at %, about 42 at %, about 45 at %, about 48 at %, or about 50 at %. For example, the silicon boron nitride layer can have a nitrogen concentration of about 20 at % to about 50 at %, about 20 at % to about 40 at %, about 20 at % to about 35 at %, about 20 at % to about 30 at %, about 20 at % to about 25 at %, about 25 at % to about 50 at %, about 25 at % to about 40 at %, about 25 at % to about 35 at %, about 25 at % to about 30 at %, about 25 at % to about 28 at %, about 30 at % to about 50 at %, about 30 at % to about 40 at %, about 30 at % to about 35 at %, or about 30 at % to about 32 at %.

The silicon boron nitride layer can have a silicon concentration of about 18 at %, about 20 at %, about 22 at %, about 25 at %, about 28 at %, or about 30 at % to about 32 at %, about 35 at %, about 38 at %, about 40 at %, about 42 at %, or about 45 at %. For example, the silicon boron nitride layer can have a silicon concentration of about 18 at % to about 45 at %, about 18 at % to about 40 at %, about 18 at % to about 35 at %, about 18 at % to about 30 at %, about 18 at % to about 25 at %, about 25 at % to about 45 at %, about 25 at % to about 40 at %, about 25 at % to about 35 at %, about 25 at % to about 30 at %, about 25 at % to about 28 at %, about 30 at % to about 45 at %, about 30 at % to about 40 at %, about 30 at % to about 35 at %, about 30 at % to about 32 at %, about 28 at % to about 40 at %, about 28 at % to about 35 at %, or about 28 at % to about 32 at %.

In one or more embodiments, the silicon boron nitride layer has a nitrogen to silicon atomic ratio of greater than 1. The silicon boron nitride layer has a nitrogen to silicon atomic ratio of about 1.05, about 1.1, about 1.15, or about 1.2 to about 1.25, about 1.3, about 1.35, about 1.4, about 1.45, or about 1.5. For example, the silicon boron nitride layer has a nitrogen to silicon atomic ratio of about 1.05 to about 1.5, about 1.05 to about 1.4, about 1.05 to about 1.35, about 1.05 to about 1.3, about 1.05 to about 1.25, about 1.05 to about 1.2, about 1.05 to about 1.1, about 1.1 to about 1.5, about 1.1 to about 1.4, about 1.1 to about 1.35, about 1.1 to about 1.3, about 1.1 to about 1.25, about 1.1 to about 1.2, about 1.15 to about 1.5, about 1.15 to about 1.4, about 1.15 to about 1.35, about 1.15 to about 1.3, about 1.15 to about 1.25, or about 1.15 to about 1.2. In some embodiments, the silicon boron nitride layer contains about 60 at % to about 80 at % of boron bonded to silicon and about 20 at % to about 40 at % of boron bonded to nitrogen.

In one or more embodiments, the silicon boron nitride layer has a leakage current of less than $1 \times 10^{-9}$ A/cm$^2$ at 1.5 MV/cm. The silicon boron nitride layer has a leakage current of about $5 \times 10^{-11}$ A/cm$^2$, about $6 \times 10^{-11}$ A/cm$^2$, about $8 \times 10^{-11}$ A/cm$^2$, about $9 \times 10^{-11}$ A/cm$^2$, or about $1 \times 10^{-10}$ A/cm$^2$ at 1.5 MV/cm to about $2 \times 10^{-10}$ A/cm$^2$, about $6 \times 10^{-10}$ A/cm$^2$, about $7.5 \times 10^{-10}$ A/cm$^2$, about $8 \times 10^{-10}$ A/cm$^2$, or about $9.9 \times 10^{-10}$ A/cm$^2$ at 1.5 MV/cm. In some examples, the silicon boron nitride layer has a leakage current of about $5 \times 10^{-11}$ A/cm$^2$ to about $9.9 \times 10^{-10}$ A/cm$^2$ at 1.5 MV/cm or about $1 \times 10^{-10}$ A/cm$^2$ to about $7 \times 10^{-10}$ A/cm$^2$ at 1.5 MV/cm.

In one or more examples, the silicon boron nitride layer contains about 10 at % to about 50 at % of boron, has a nitrogen to silicon atomic ratio of about 1.05 to about 1.5, and has a leakage current of less than $1 \times 10^{-9}$ A/cm$^2$ at 1.5 MV/cm. In other examples, the silicon boron nitride layer contains about 20 at % to about 35 at % of boron, has a nitrogen to silicon atomic ratio of about 1.1 to about 1.4, and has a leakage current of about $5 \times 10^{-11}$ A/cm$^2$ to about $9.9 \times 10^{-10}$ A/cm$^2$ at 1.5 MV/cm.

The silicon boron nitride layer has a thickness of about 50 Å, about 80 Å, about 100 Å, about 120 Å, or about 150 Å to about 180 Å, about 200 Å, about 250 Å, about 300 Å, about 400 Å, about 500 Å, about 600 Å, about 700 Å, about 800 Å, or about 1,000 Å. For example, the silicon boron nitride layer has a thickness of about 50 Å to about 1,000 Å, about 50 Å to about 800 Å, about 50 Å to about 600 Å, about 50 Å to about 500 Å, about 50 Å to about 400 Å, about 50 Å to about 300 Å, about 50 Å to about 200 Å, about 50 Å to about 150 Å, about 50 Å to about 100 Å, about 50 Å to about 80 Å, about 80 Å to about 1,000 Å, about 80 Å to about 800 Å, about 80 Å to about 600 Å, about 80 Å to about 500 Å, about 80 Å to about 400 Å, about 80 Å to about 300

Å, about 80 Å to about 200 Å, about 80 Å to about 150 Å, about 80 Å to about 100 Å, about 100 Å to about 1,000 Å, about 100 Å to about 800 Å, about 100 Å to about 600 Å, about 100 Å to about 500 Å, about 100 Å to about 400 Å, about 100 Å to about 300 Å, about 100 Å to about 200 Å, or about 100 Å to about 150 Å.

In some examples, the silicon boron nitride layer is a stopper layer and has a thickness of about 50 Å, about 80 Å, about 100 Å, about 120 Å, or about 150 Å to about 180 Å, about 200 Å, about 250 Å, or about 300 Å. For example, a stopper layer contains silicon boron nitride and has a thickness of about 50 Å to about 300 Å, about 100 Å to about 200 Å, or about 125 Å to about 175 Å. In other examples, the silicon boron nitride layer is a supporter layer and has a thickness of about 100 Å, about 120 Å, about 150 Å, about 180 Å, or about 200 Å to about 220 Å, about 250 Å, about 280 Å, about 300 Å, about 350 Å, about 400 Å, about 450 Å, about 500 Å, or about 600 Å. For example, a supporter layer contains silicon boron nitride and has a thickness of about 100 Å to about 600 Å, about 300 Å to about 500 Å, or about 350 Å to about 450 Å.

FIG. 1 is a schematic cross-sectional view of a process chamber 100, such as a PE-CVD chamber, utilized during one or more methods for forming silicon boron nitride materials and layers. The process chamber 100 includes a chamber body 102 coupled a vacuum pump 104 and an input manifold 106 coupled to a first gas source 108 and a second gas source 110. The chamber body 102 defines or otherwise contains a process region 112 that includes a pedestal 114 disposed therein to support a substrate 101. The pedestal 114 includes heating elements (not shown) and a mechanism (not shown) that retains the substrate 101 on the pedestal 114, such as an electrostatic chuck, a vacuum chuck, a substrate retaining clamp, or the like. The pedestal 114 is coupled to and movably disposed in the process region 112 by a stem 116 connected to a lift chamber (not shown) that moves the pedestal 114 between an elevated processing position and a lowered position that facilitates transfer of the substrate 101 to and from the process chamber 100 through an opening 118 of the chamber body 102.

A first flow controller 120, such as a mass flow control (MFC) device, is disposed between the first gas source 108 and the input manifold 106 to control a first flow of a first process gases from the first gas source 108 to a showerhead assembly 124, used for distributing the first process gases across the process region 112. The showerhead assembly can include a faceplate 121, a blocker plate 123, and a gas box 125, as depicted in FIG. 1. The first and second process gases can be maintained separately through the input manifold 106 and subsequently combined just upstream of the gas box 125.

In one or more examples, a first flow of the first process gas via line 131 is transferred from the first gas source 108 through the input manifold 106, a second flow of the second process gas via line 133 is transferred from the second gas source 110 through the input manifold 106, and both the first flow of the first process gas via line 131 and the second flow of the second process gas via line 133 are combined to produce a third flow of a third process gas via line 135 prior to being introduced into the gas box 125 and eventually into the process region 112.

The third flow of the third process gas via line 135 can be maintained at a temperature low enough to keep some the precursors (e.g., diborane, silane, and/or ammonia) from reacting in the lines and causing dusting or particulate throughout the showerhead assembly 124, the process region 112, and/or on the substrate 101. In some examples, the third flow of the third process gas via line 135 is maintained at a temperature of less than 165° C., such as about 20° C., about 25° C., about 35° C., about 50° C., about 65° C., about 90° C., or about 100° C. to about 110° C., about 125° C., about 135° C., about 150° C., about 160° C., or about 164° C. For example, the third flow of the third process gas via line 135 is maintained at a temperature of about 20° C. to less than 165° C., about 50° C. to less than 165° C., about 75° C. to less than 165° C., about 90° C. to less than 165° C., about 100° C. to less than 165° C., about 120° C. to less than 165° C., about 150° C. to less than 165° C., about 20° C. to about 160° C., about 50° C. to about 160° C., about 75° C. to about 160° C., about 90° C. to about 160° C., about 100° C. to about 160° C., about 120° C. to about 160° C., about 150° C. to about 160° C., about 20° C. to about 140° C., about 50° C. to about 140° C., about 75° C. to about 140° C., about 90° C. to about 140° C., about 100° C. to about 140° C., or about 120° C. to about 140° C.

According to one or more embodiments, which can be combined with other embodiments described herein, the first process gas includes at least one or more silicon-containing precursors, one or more nitrogen-containing precursors, and one or more carrier and/or process gases (e.g., helium, argon, hydrogen, and/or nitrogen). For example, the first process gas includes silane ($SiH_4$), ammonia ($NH_3$), helium (He), nitrogen ($N_2$), argon (Ar), and hydrogen ($H_2$). A second controller 122 is disposed between the second gas source 110 and the input manifold 106 to control a second flow of a second process gases from the second gas source 110 to the showerhead assembly 124 for distributing the second process gas across the process region 112. According to one or more embodiments, which can be combined with other embodiments described herein, the second process gas includes at least one or more boron-containing precursors and hydrogen gas, such as a mixture of diborane ($B_2H_6$) and hydrogen ($H_2$).

The showerhead assembly 124 is coupled to and in fluid communication with a remote plasma system (RPS) 105. The RPS 105 can be used to form a plasma in the process region 112 from the first and second process gases in the process region 112. In some examples, the plasma is ignited or otherwise generated in the RPS 105 disposed outside of the chamber body 102. The plasma is transferred or otherwise introduced into the process region 112 while depositing the silicon boron nitride layer on the substrate 101.

A third gas source 128 can be coupled to the chamber body 102 for providing additional process gas (e.g., argon, helium, nitrogen, or combinations thereof) to control the pressure within the process region 112. A controller 130 is coupled to the process chamber 100 and configured to control process conditions of the process chamber 100 during a deposition process or other processes.

Figure 2:
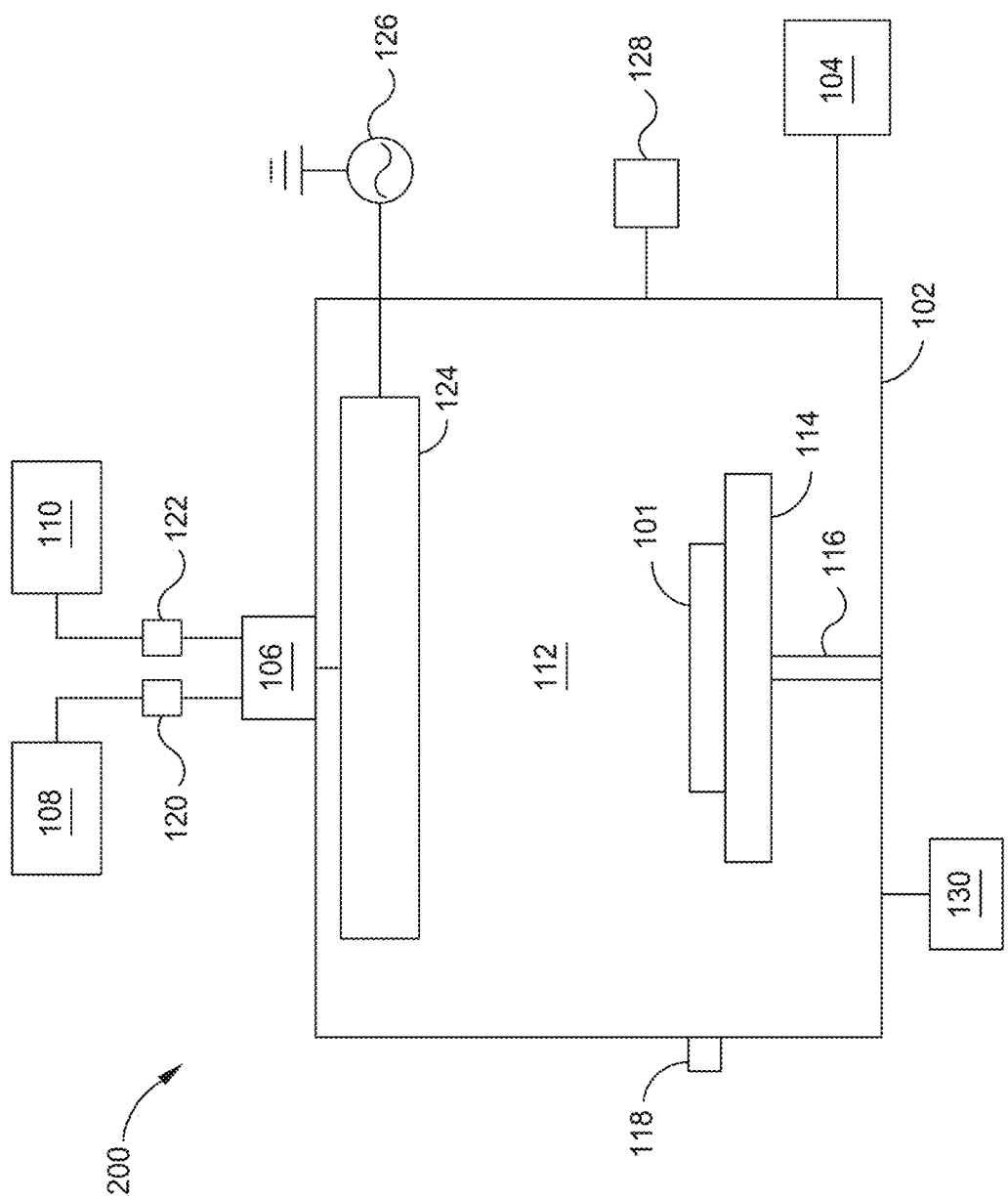
FIG. 2 depicts a schematic cross-sectional view of another process chamber, according to one or more embodiments described and discussed herein.

FIG. 2 is a schematic cross-sectional view of a process chamber 200, such as a PE-CVD chamber, utilized for the method of forming the silicon boron nitride layer, as described and discussed herein by other embodiments. The process chamber 200 includes the chamber body 102 coupled the vacuum pump 104 and the manifold 106 coupled to the first gas source 108 and the second gas source 110. The chamber body 102 defines or otherwise contains the process region 112 that includes the pedestal 114 disposed therein to support the substrate 101. The pedestal 114 includes heating elements (not shown) and a mechanism (not shown) that retains the substrate 101 on the pedestal 114, such as an electrostatic chuck, a vacuum chuck, a substrate retaining clamp, or the like. The pedestal 114 is coupled to and movably disposed in the process region 112 by the stem 116 connected to a lift chamber (not shown) that moves the pedestal 114 between an elevated processing position and a lowered position that facilitates transfer of the substrate 101 to and from the process chamber 200 through the opening 118 of the chamber body 102.

The first flow controller 120, such as an MFC device, is disposed between the first gas source 108 and the input manifold 106 to control a first flow of a first process gases from the first gas source 108 to the showerhead assembly 124, used for distributing the first process gases across the process region 112. According to embodiments, which can be combined with other embodiments described herein, the first process gas includes at least silane ($SiH_4$), ammonia ($NH_3$), helium (He), nitrogen ($N_2$), argon (Ar), and hydrogen ($H_2$). The second controller 122 is disposed between the second gas source 110 and the input manifold 106 to control a second flow of a second process gases from the second gas source 110 to the showerhead assembly 124 for distributing the second process gas across the process region 112. According to embodiments, which can be combined with other embodiments described herein, the second process gas includes at least diborane ($B_2H_6$) and hydrogen ($H_2$). The showerhead assembly 124 is coupled to a radio frequency (RF) power source 126 for forming a plasma in the process region 112 from the first and second process gases in the process region 112. The third gas source 128 can be coupled to the chamber body 102 for providing additional process gas (e.g., argon, helium, nitrogen, or combinations thereof) to control the pressure within the process region 112. The controller 130 is coupled to the process chamber 200 and configured to control aspects of the process chamber 200 during processing.

Figure 3:
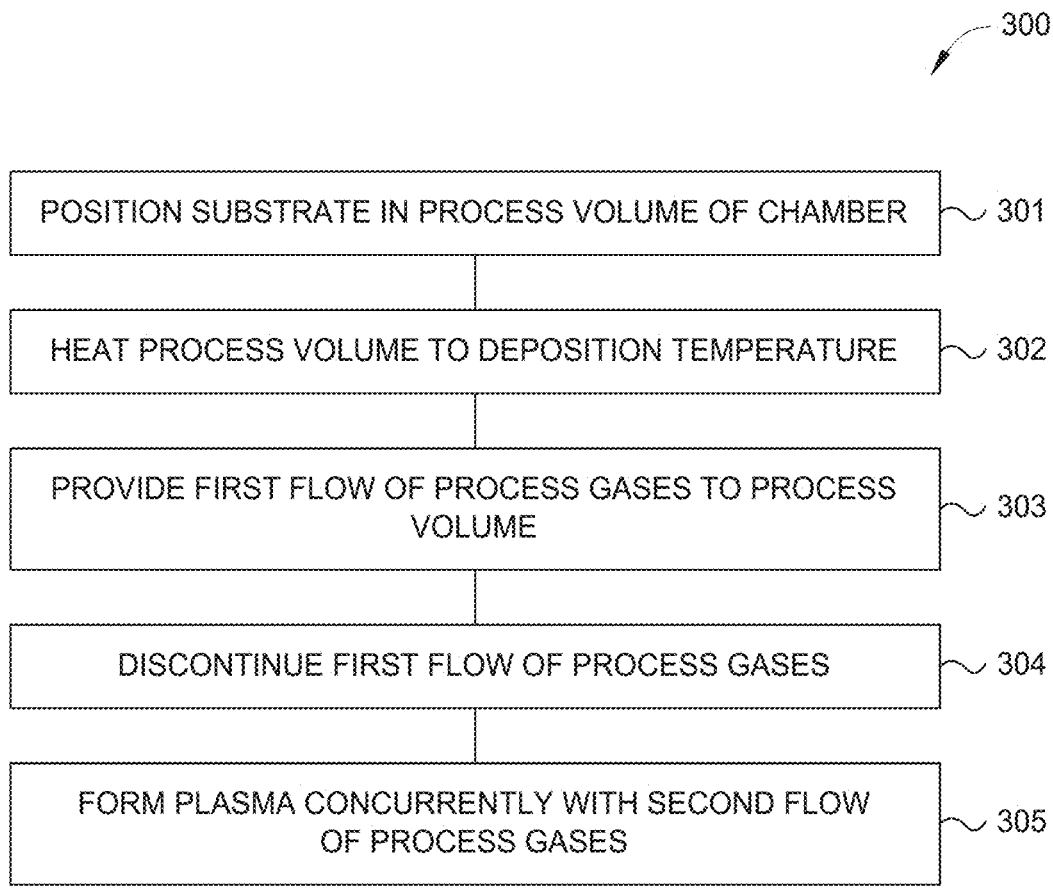
FIG. 3 is a flow diagram of a method of forming a silicon boron nitride layer, according to one or more embodiments described and discussed herein.

FIG. 3 is a flow diagram of a method 300 of forming a silicon boron nitride layer. To facilitate explanation, FIG. 3 will be described with reference to FIGS. 1 and 2. However, it is to be noted that a chamber other than the process chamber 100 and 200 may be utilized in conjunction with the method 300. At operation 301, a substrate 101 is positioned in the process region 112 of the process chamber 100, 200. The substrate 101 is positioned at a process distance between the pedestal 114 and the showerhead assembly 124 of about 100 mil (about 2.5 millimeter (mm)) to about 5,000 mil (about 127 mm) or about 200 mil (about 5 mm) to about 1,000 mil (about 25.4 mm). At operation 302, the process region 112 is heated to a deposition temperature of about 575° C. or less. The deposition temperature is maintained during the method 300. According to embodiments, which can be combined with other embodiments described herein, the process region 112 the deposition temperature of about 550° C. or less is obtained by heating the pedestal 114. For example, the deposition temperature is about 225° C. to about 575° C. The process region 112 during the method 300 is maintained at a pressure of about 2 Torr to about 8 Torr or about 3 Torr to about 6 Torr.

At operation 303, a first flow of the first process gases is provided to the process region 112. The first flow of the first process gas includes about 0 sccm to about 2,000 sccm or about 1 sccm to about 500 sccm of silane, about 0 sccm to about 1,000 sccm or about 10 sccm to about 5,000 sccm of ammonia, about 0 sccm to about 50,000 sccm or about 500 sccm to about 20,000 sccm of helium, about 0 sccm to about 50,000 sccm or about 5,000 sccm to about 25,000 sccm of nitrogen ($N_2$), about 0 sccm to about 50,000 sccm or about 50 sccm to about 10,000 sccm of argon, and about 0 sccm to about 50,000 sccm or about 50 sccm to about 20,000 sccm of hydrogen ($H_2$). At operation 304, the first flow of the first process gases is discontinued. At operation 305, a plasma is formed concurrently with a second flow of the second process gases provided to the process region 112. According to embodiments, which can be combined with other embodiments described herein, plasma is introduced and/or generated in the process region 112 by the RPS 105 in process chamber 100 or by RF power provided from the RF power source 126 to the showerhead assembly 124 in process chamber 200. The second flow of the second process gas includes about 0 sccm to about 10,000 sccm or about 1 sccm to about 5,000 sccm of the second process gases. About 2 mol % to about 15 mol % of the flow of the second process gases is diborane and the remaining being hydrogen ($H_2$). The method 300 forms a silicon boron nitride layer having the boron concentration of about 10 at % to about 50 at % or about 10 at % to about 20 at % and the leakage current is less than $1\times10^{-9}$ $A/cm^2$ at 1.5 MV/cm.

Figure 4:
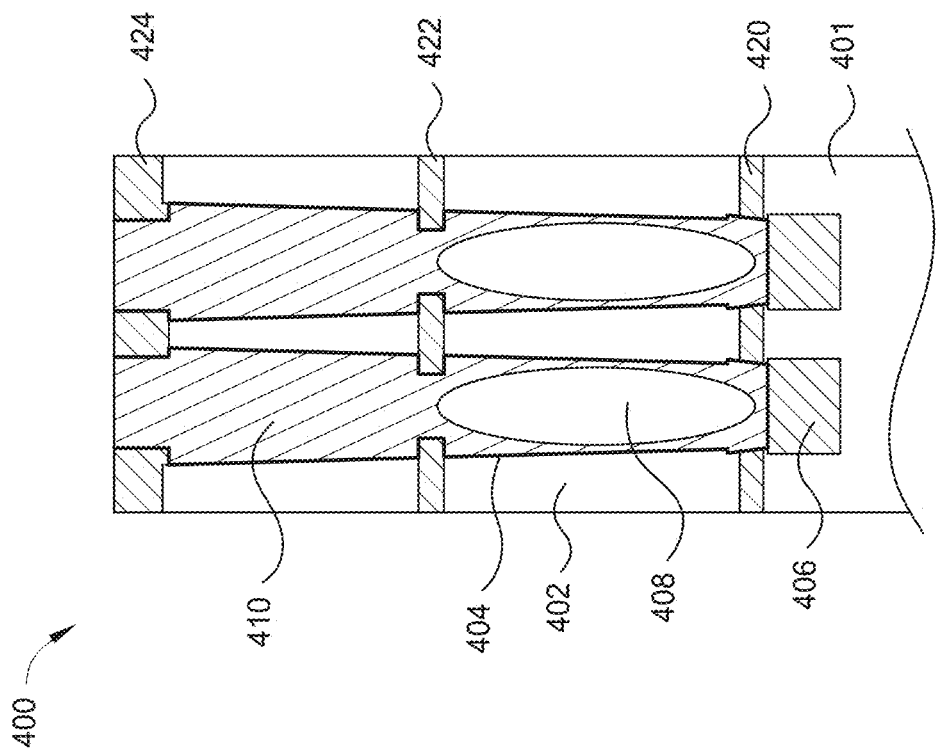
FIG. 4 depicts a capacitor device containing silicon boron nitride layers which can be deposited or otherwise produced by methods according to one or more embodiments described and discussed herein.

FIG. 4 depicts a capacitor device 400 containing one or more silicon boron nitride layers or materials which can be deposited or otherwise produced on a substrate 401 by methods according to one or more embodiments described and discussed herein. The capacitor device 400 is formed in a dielectric layer 402 disposed on the substrate 401. The dielectric layer 402 can be or include one or more dielectric materials, such as silicon (e.g., amorphous silicon). A nitride barrier layer 404 is disposed on the walls of the vias formed within the dielectric layer 402, as well as disposed on metal contacts 406. The nitride barrier layer 404 contains one or more metal nitride materials, such as titanium nitride, tantalum nitride, tungsten nitride, silicides thereof, dopants thereof, or any combination thereof. The metal contact 406 contains copper, tungsten, aluminum, chromium, cobalt, alloys thereof, or any combination thereof. An oxide layer 410 is contained within the nitride barrier layer 404 and containing one or more holes or voids 408 defined by or otherwise formed in the oxide layer 410. The oxide layer can be or include silicon oxide or a dopant thereof. A stopper layer 420 containing silicon boron nitride can be disposed in a lower portion of the capacitor device 400, a supporter layer 422 containing silicon boron nitride can be disposed in a middle portion of the capacitor device 400, a supporter layer 424 containing silicon boron nitride can be disposed in an upper portion of the capacitor device 400, as depicted in FIG. 4.

In one or more embodiments, methods for forming the silicon boron nitride layer include positioning the substrate on the pedestal in the process region within the process chamber and introducing a first flow of a first process gas and a second flow of a second process gas to the process region. The first flow of the first process gas contains one or more silicon-containing precursors, one or more nitrogen containing precursors, hydrogen ($H_2$), and at least two gases selected from argon, helium, nitrogen ($N_2$), or any combination thereof. The method also includes forming a plasma concurrently with the first flow of the first process gas and the second flow of the second process gas to the process region and exposing the substrate to the first process gas, the second process gas, and the plasma to deposit the silicon boron nitride layer on the substrate.

In other embodiments, methods for forming the silicon boron nitride layer include positioning the substrate on the pedestal in the process region within the process chamber, heating the pedestal retaining the substrate to a deposition temperature, maintaining the process region at a process pressure as described and discussed above, and introducing a first flow of a first process gas to the process region. The first flow of the first process gas contains one or more silicon-containing precursors, one or more nitrogen containing precursors, helium, nitrogen (N$_2$), argon, and hydrogen (H$_2$). The method further includes discontinuing the first flow of the first process gases, forming a plasma concurrently with a second flow of a second process gas containing one or more boron-containing precursors and hydrogen (H$_2$) to the process region, and forming the silicon boron nitride layer on the substrate.

In summation, a method of forming a silicon boron nitride layer having a boron concentration of about 20 at % to about 40 at % and a leakage current of less than 1×10$^{-9}$ A/cm$^2$ at 1.5 MV/cm is provided. The utilization of hydrogen gas allows for the formation of a nitrogen-rich, silicon-rich, and boron-rich layer. Hydrogen gas breaks Si—H bonds to remove in-layer hydrogen and create dangling bonds while process gases react with the active surface (e.g., the dangling bonds) of the substrate to create Si—Si bonds, Si—N bonds, and Si—B bonds.

Embodiments of the present disclosure further relate to any one or more of the following paragraphs 1-35:

1. A method of forming a silicon boron nitride layer, comprising: positioning a substrate on a pedestal in a process region within a process chamber; heating a pedestal retaining the substrate to a deposition temperature of about 225° C. to about 575° C.; introducing a first flow of a first process gas and a second flow of a second process gas to the process region, wherein: the first flow of the first process gas comprises: silane having a flow rate of about 1 sccm to about 500 sccm, ammonia having a flow rate of about 10 sccm to about 5,000 sccm, helium having a flow rate of about 500 sccm to about 20,000 sccm, nitrogen (N$_2$) having a flow rate of about 5,000 sccm to about 25,000 sccm, argon having a flow rate of about 50 sccm to about 10,000 sccm, and hydrogen (H$_2$) having a flow rate of about 50 sccm to about 20,000 sccm, and the second flow of the second process gas comprises: about 2 molar percent (mol %) to about 15 mol % of diborane, about 85 mol % to about 98 mol % of hydrogen (H$_2$), and a flow rate of about 1 sccm to about 5,000 sccm; forming a plasma concurrently with the first flow of the first process gas and the second flow of the second process gas to the process region; and exposing the substrate to the first process gas, the second process gas, and the plasma to deposit the silicon boron nitride layer on the substrate.

2. A method of forming a silicon boron nitride layer, comprising: positioning a substrate on a pedestal in a process region within a process chamber; introducing a first flow of a first process gas and a second flow of a second process gas to the process region, wherein: the first flow of the first process gas comprises a silicon-containing precursor, a nitrogen-containing precursor, hydrogen (H$_2$), and at least two gases selected from the group consisting of argon, helium, nitrogen (N$_2$), and any combination thereof, and the second flow of the second process gas comprises: about 2 molar percent (mol %) to about 15 mol % of diborane, about 85 mol % to about 98 mol % of hydrogen (H$_2$), and a flow rate of about 1 sccm to about 5,000 sccm; forming a plasma concurrently with the first flow of the first process gas and the second flow of the second process gas to the process region; and exposing the substrate to the first process gas, the second process gas, and the plasma to deposit the silicon boron nitride layer on the substrate, wherein the silicon boron nitride layer comprises about 10 atomic percent (at %) to about 50 at % of boron, wherein the silicon boron nitride layer has a nitrogen to silicon atomic ratio of about 1.05 to about 1.5, and wherein the silicon boron nitride layer has a leakage current of less than 1×10$^{-9}$ A/cm$^2$ at 1.5 MV/cm.

3. A method of forming a silicon boron nitride layer, comprising: positioning a substrate on a pedestal in a process region within a process chamber; heating a pedestal retaining the substrate to a deposition temperature of about 225° C. to about 575° C.; maintaining the process region at a pressure of about 2 Torr to about 8 Torr; introducing a first flow of a first process gas to the process region, wherein the first flow of the first process gas comprises: silane having a flow rate of about 1 sccm to about 500 sccm, ammonia having a flow rate of about 10 sccm to about 5,000 sccm, helium having a flow rate of about 500 sccm to about 20,000 sccm, nitrogen (N$_2$) having a flow rate of about 5,000 sccm to about 25,000 sccm, argon having a flow rate of about 50 sccm to about 10,000 sccm, and hydrogen (H$_2$) having a flow rate of about 50 sccm to about 20,000 sccm; discontinuing the first flow of the first process gases; forming a plasma concurrently with a second flow of a second process gas to the process region, wherein the second flow of the second process gas has a flow rate of about 1 sccm to about 5,000 sccm and comprises about 2 molar percent (mol %) to about 15 mol % of diborane and about 85 mol % to about 98 mol % of hydrogen (H$_2$); and forming the silicon boron nitride layer on the substrate.

4. The method according to any one of paragraphs 1-3, wherein the silicon boron nitride layer comprises about 10 atomic percent (at %) to about 50 at % of boron.

5. The method according to any one of paragraphs 1-4, wherein the silicon boron nitride layer comprises about 10 at % to about 20 at % of boron.

6. The method according to any one of paragraphs 1-5, wherein the silicon boron nitride layer comprises about 20 at % to about 30 at % of boron.

7. The method according to any one of paragraphs 1-6, wherein the silicon boron nitride layer comprises about 15 at % to about 30 at % of boron.

8. The method according to any one of paragraphs 1-7, wherein the silicon boron nitride layer comprises about 15 at % to about 20 at % of boron.

9. The method according to any one of paragraphs 1-8, wherein the silicon boron nitride layer has a nitrogen to silicon atomic ratio of about 1.05 to about 1.5.

10. The method according to any one of paragraphs 1-9, wherein the silicon boron nitride layer has a nitrogen to silicon atomic ratio of about 1.1 to about 1.4.

11. The method according to any one of paragraphs 1-10, wherein the silicon boron nitride layer has a nitrogen to silicon atomic ratio of about 1.15 to about 1.35.

12. The method according to any one of paragraphs 1-11, wherein the silicon boron nitride layer comprises about 5 at % to about 15 at % of hydrogen.

13. The method according to any one of paragraphs 1-12, wherein the silicon boron nitride layer has a leakage current of less than 1×10$^{-9}$ A/cm$^2$ at 1.5 MV/cm.

14. The method according to any one of paragraphs 1-13, wherein the silicon boron nitride layer has a leakage current of about 5×10$^{-11}$ A/cm$^2$ to about 9.9×10$^{-10}$ A/cm$^2$ at 1.5 MV/cm.

15. The method according to any one of paragraphs 1-14, wherein the silicon boron nitride layer has a leakage current of about 1×10$^{-10}$ A/cm$^2$ to about 7×10$^{-10}$ A/cm$^2$ at 1.5 MV/cm.

16. The method according to any one of paragraphs 1-15, wherein the silicon boron nitride layer comprises: about 60 at % to about 80 at % of boron bonded to silicon; and about 20 at % to about 40 at % of boron bonded to nitrogen.

17. The method according to any one of paragraphs 1-16, wherein the deposition temperature is about 350° C. to about 560° C.

18. The method according to any one of paragraphs 1-17, wherein the deposition temperature is about 450° C. to about 550° C.

19. The method according to any one of paragraphs 1-18, wherein the first flow of the first process gas and the second flow of the second process gas are combined to produce a third flow of a third process gas prior to being introduced into the process region.

20. The method of paragraph 19, wherein the third flow of the third process gas is maintained at a temperature of about 20° C. to less than 165° C.

21. The method according to any one of paragraphs 1-20, wherein the first flow of the first process gas comprises: the silane having a flow rate of about 10 sccm to about 250 sccm, the ammonia having a flow rate of about 50 sccm to about 2,000 sccm, the helium having a flow rate of about 750 sccm to about 15,000 sccm, the nitrogen having a flow rate of about 10,000 sccm to about 20,000 sccm, the argon having a flow rate of about 200 sccm to about 7,500 sccm, and the hydrogen having a flow rate of about 200 sccm to about 15,000 sccm.

22. The method according to any one of paragraphs 1-21, wherein the first flow of the first process gas comprises: the silane having a flow rate of about 20 sccm to about 100 sccm, the ammonia having a flow rate of about 100 sccm to about 1,000 sccm, the helium having a flow rate of about 1,000 sccm to about 10,000 sccm, the nitrogen having a flow rate of about 12,000 sccm to about 18,000 sccm, the argon having a flow rate of about 500 sccm to about 5,000 sccm, and the hydrogen having a flow rate of about 500 sccm to about 10,000 sccm.

23. The method according to any one of paragraphs 1-22, wherein the second flow of the second process gas comprises: about 3 mol % to about 12 mol % of the diborane, about 88 mol % to about 97 mol % of the hydrogen, and a flow rate of about 5 sccm to about 2,000 sccm.

24. The method according to any one of paragraphs 1-23, wherein the second flow of the second process gas comprises: about 5 mol % to about 10 mol % of the diborane, about 90 mol % to about 95 mol % of the hydrogen, and a flow rate of about 10 sccm to about 1,000 sccm.

25. The method according to any one of paragraphs 1-24, further comprising maintaining the process region at a pressure of about 2 Torr to about 8 Torr.

26. The method according to any one of paragraphs 1-25, wherein the pedestal is positioned at a process distance between the pedestal and a showerhead of the process chamber, and wherein the process distance is about 200 mil to about 1,000 mil.

27. The method according to any one of paragraphs 1-26, wherein the silicon boron nitride layer is located in a capacitor device disposed on the substrate.

28. The method according to any one of paragraphs 1-27, wherein the silicon boron nitride layer is a supporter layer of a capacitor device.

29. The method according to any one of paragraphs 1-28, wherein the silicon boron nitride layer is a stopper layer of a capacitor device.

30. The method according to any one of paragraphs 1-29, wherein the silicon boron nitride layer has a thickness of about 50 Å to about 800 Å.

31. The method according to any one of paragraphs 1-30, wherein the silicon boron nitride layer is stopper layer and has a thickness of about 100 Å to about 200 Å, or a thickness of about 150 Å.

32. The method according to any one of paragraphs 1-31, wherein the silicon boron nitride layer is supporter layer and has a thickness of about 200 Å to about 600 Å, or a thickness of about 400 Å.

33. The method according to any one of paragraphs 1-32, further comprising: generating the plasma in a remote plasma system disposed outside of the process chamber; and transferring the plasma into the process region while depositing the silicon boron nitride layer on the substrate.

34. The method according to any one of paragraphs 1-33, wherein the silicon boron nitride layer comprises about 20 at % to about 35 at % of boron, wherein the silicon boron nitride layer has a nitrogen to silicon atomic ratio of about 1.1 to about 1.4, and wherein the silicon boron nitride layer has a leakage current of about $5 \times 10^{-11}$ A/cm$^2$ to about $9.9 \times 10^{-10}$ A/cm$^2$ at 1.5 MV/cm.

35. The silicon boron nitride layer or a silicon boron nitride material made, produced, deposited, or otherwise formed by any one of the methods according to paragraphs 1-34.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:
1. A capacitor device, comprising:
   a stopper layer comprising silicon boron nitride and disposed on a substrate, wherein the silicon boron nitride comprises about 18 atomic percent (at %) to about 50 at % of boron;
   a dielectric layer disposed on the stopper layer;
   vias formed within the dielectric layer and the stopper layer;
   metal contacts disposed on bottoms of the vias, wherein each via contains one of the metal contacts;

a nitride barrier layer comprising a metal nitride material and disposed on walls of the vias and disposed on the metal contacts; and an oxide layer disposed within the vias on the nitride barrier layer, wherein the oxide layer comprises one or more holes or voids formed therein.

2. The capacitor device of claim 1, further comprising a first support layer disposed above the stopper layer, wherein a first portion of the dielectric layer is between the stopper layer and the first support layer, and wherein the first support layer comprises the silicon boron nitride.

3. The capacitor device of claim 2, further comprising a second support layer disposed above the first support layer, wherein a second portion of the dielectric layer is between the first support layer and the second support layer, and wherein the second support layer comprises the silicon boron nitride.

4. The capacitor device of claim 1, wherein the silicon boron nitride comprises 25 at % to about 45 at % of boron.

5. The capacitor device of claim 1, wherein the silicon boron nitride comprises 25 at % to 50 at % of boron.

6. The capacitor device of claim 1, wherein the silicon boron nitride has a nitrogen to silicon atomic ratio of about 1.05 to about 1.5.

7. The capacitor device of claim 1, wherein the silicon boron nitride has a nitrogen to silicon atomic ratio of about 1.1 to about 1.4.

8. The capacitor device of claim 1, wherein the silicon boron nitride comprises about 5 at % to about 15 at % of hydrogen.

9. The capacitor device of claim 1, wherein the silicon boron nitride has a leakage current of about $5\times10^{-11}$ A/cm$^2$ to about $9.9\times10^{-10}$ A/cm$^2$ at 1.5 MV/cm.

10. The capacitor device of claim 1, wherein the silicon boron nitride has a leakage current of less than $1\times10^{-9}$ A/cm$^2$ at 1.5 MV/cm.

11. The capacitor device of claim 1, wherein the silicon boron nitride comprises:
about 60 at % to about 80 at % of boron bonded to silicon; and
about 20 at % to about 40 at % of boron bonded to nitrogen.

12. The capacitor device of claim 1, wherein the silicon boron nitride has a thickness of about 50 Å to about 800 Å.

13. The capacitor device of claim 1, wherein the dielectric layer comprises amorphous silicon, and wherein the oxide layer comprises silicon oxide.

14. The capacitor device of claim 1, wherein the metal nitride material comprises titanium nitride, tantalum nitride, tungsten nitride, silicides thereof, dopants thereof, or any combination thereof.

15. The capacitor device of claim 1, wherein the metal contact comprises copper, tungsten, aluminum, chromium, cobalt, alloys thereof, or any combination thereof.

16. A capacitor device, comprising:
a stopper layer comprising silicon boron nitride and disposed on a substrate;
a dielectric layer disposed on the stopper layer;
vias formed within the dielectric layer and the stopper layer;
metal contacts disposed on bottoms of the vias, wherein each via contains one of the metal contacts;
a barrier layer disposed on walls of the vias and disposed on the metal contacts;
an oxide layer disposed within the vias on the barrier layer, wherein the oxide layer comprises one or more holes or voids formed therein;
a first support layer disposed above the stopper layer, wherein a first portion of the dielectric layer is between the stopper layer and the first support layer; and
a second support layer disposed above the first support layer, wherein a second portion of the dielectric layer is between the first support layer and the second support layer.

17. The capacitor device of claim 16, wherein each of the first support layer and the second support layer comprises the silicon boron nitride.

18. The capacitor device of claim 17, wherein the silicon boron nitride comprises 25 atomic percent (at %) to about 50 at % of boron.

19. A capacitor device, comprising:
a stopper layer comprising silicon boron nitride and disposed on a substrate, wherein the silicon boron nitride comprises about 18 atomic percent (at %) to about 50 at % of boron;
a dielectric layer disposed on the stopper layer;
vias formed within the dielectric layer and the stopper layer;
metal contacts disposed on bottoms of the vias, wherein each via contains one of the metal contacts;
a barrier layer disposed on walls of the vias and disposed on the metal contacts; and
an oxide layer disposed within the vias on the barrier layer, wherein the oxide layer comprises one or more holes or voids formed therein.

20. The capacitor device of claim 19, wherein the silicon boron nitride comprises:
25 at % to about 50 at % of boron;
about 5 at % to about 15 at % of hydrogen;
about 60 at % to about 80 at % of boron bonded to silicon;
about 20 at % to about 40 at % of boron bonded to nitrogen;
a nitrogen to silicon atomic ratio of about 1.05 to about 1.5; and
a leakage current of about $5\times10^{-11}$ A/cm$^2$ to about $9.9\times10^{-10}$ A/cm$^2$ at 1.5 MV/cm.

* * * * *